(12) United States Patent
Choi

(10) Patent No.: US 7,919,404 B2
(45) Date of Patent: Apr. 5, 2011

(54) METHOD OF MANUFACTURING SEMICONDUCTOR DEVICE INCLUDING FORMING A T-SHAPE GATE ELECTRODE

(75) Inventor: Myoung Kyu Choi, Chungbuk (KR)

(73) Assignee: MagnaChip Semiconductor, Ltd., Chungcheongbuk-do (KR)

( * ) Notice: Subject to any disclaimer, the term of this patent is extended or adjusted under 35 U.S.C. 154(b) by 0 days.

(21) Appl. No.: 12/318,390

(22) Filed: Dec. 29, 2008

(65) Prior Publication Data

US 2009/0170253 A1    Jul. 2, 2009

(30) Foreign Application Priority Data

Dec. 28, 2007  (KR) ................ 10-2007-0140367

(51) Int. Cl.
*H01L 21/28*  (2006.01)

(52) U.S. Cl. ........ 438/574; 438/586; 438/634; 438/637; 257/E21.205; 257/E21.585

(58) Field of Classification Search ................ 438/634, 438/636, 637, 695, 700, 740, 574, 586; 257/E21.205, E21.585, E21.577
See application file for complete search history.

(56) References Cited

U.S. PATENT DOCUMENTS

| | | | | |
|---|---|---|---|---|
| 5,688,704 | A * | 11/1997 | Liu | 438/303 |
| 6,284,613 | B1 * | 9/2001 | Subrahmanyam et al. | 438/307 |
| 6,534,351 | B2 * | 3/2003 | Muller et al. | 438/182 |
| 6,995,452 | B2 | 2/2006 | Cho et al. | 257/538 |
| 7,432,563 | B2 * | 10/2008 | Behammer | 257/401 |
| 2004/0203198 | A1 * | 10/2004 | Cho et al. | 438/200 |

FOREIGN PATENT DOCUMENTS

| | | |
|---|---|---|
| FR | 10-2006-0010245 A | 2/2006 |
| KR | 1996-0035915 | 10/1996 |
| KR | 10-0509948 B1 | 10/2004 |
| KR | 2004-0085688 | 10/2004 |

* cited by examiner

*Primary Examiner* — Khiem D Nguyen
(74) *Attorney, Agent, or Firm* — Morgan, Lewis & Bockius LLP

(57) ABSTRACT

The present invention provides a method of manufacturing a semiconductor device, which comprises the steps of: forming a buffer layer formed of a dual-layer structure of a buffer oxide film and a buffer nitride film on a semiconductor substrate formed with a certain lower structure; forming source/drain by performing an ion injection process after forming the buffer layer; defining a gate hole by etching the buffer layer after forming the source/drain; forming a gate oxide film on the defined gate hole; forming a gate material to bury the defined gate hole; forming a T-shape gate electrode through a process of etching the gate material using the buffer nitride film as an etching stop film; and forming a contact hole after forming an inter-layer dielectric on a resulting structure formed with the T-shape gate electrode.

5 Claims, 7 Drawing Sheets

[Fig. 1a]
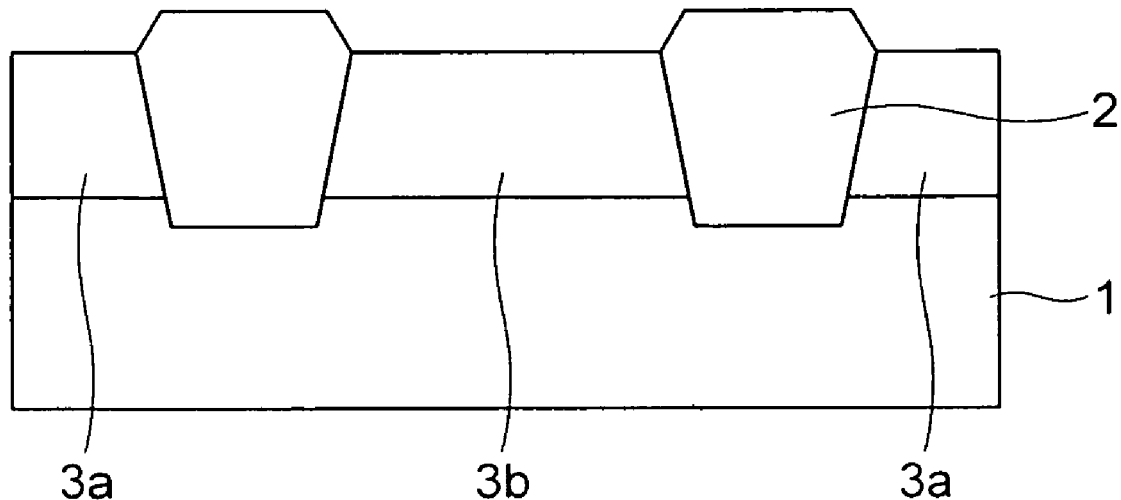
[Fig. 1b]
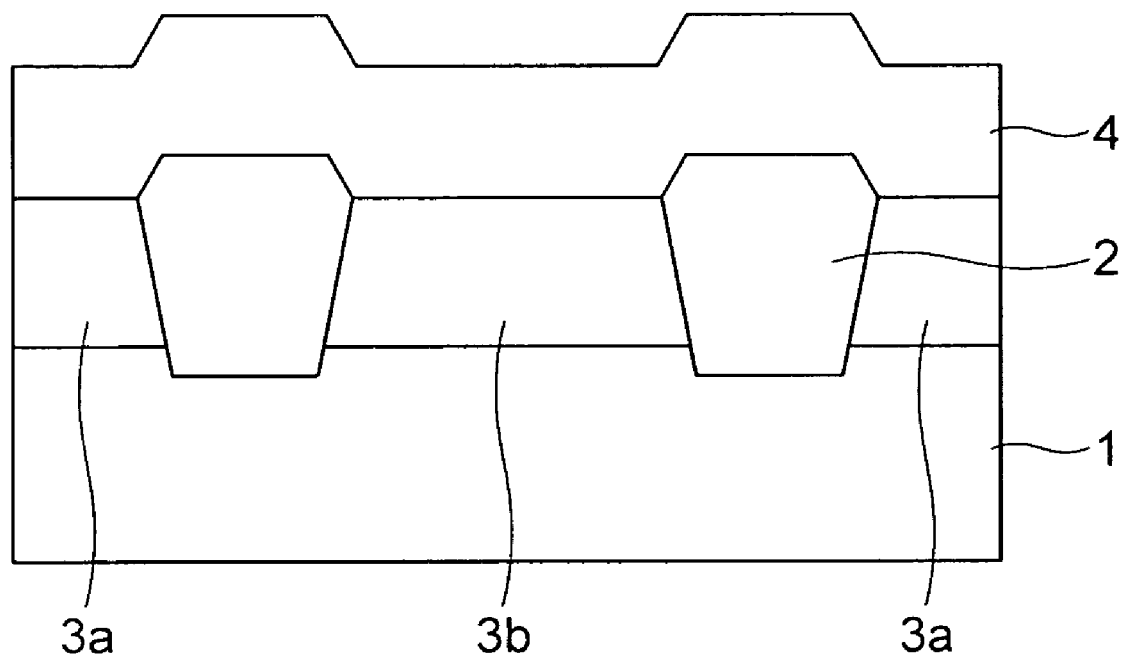

[Fig. 1c]
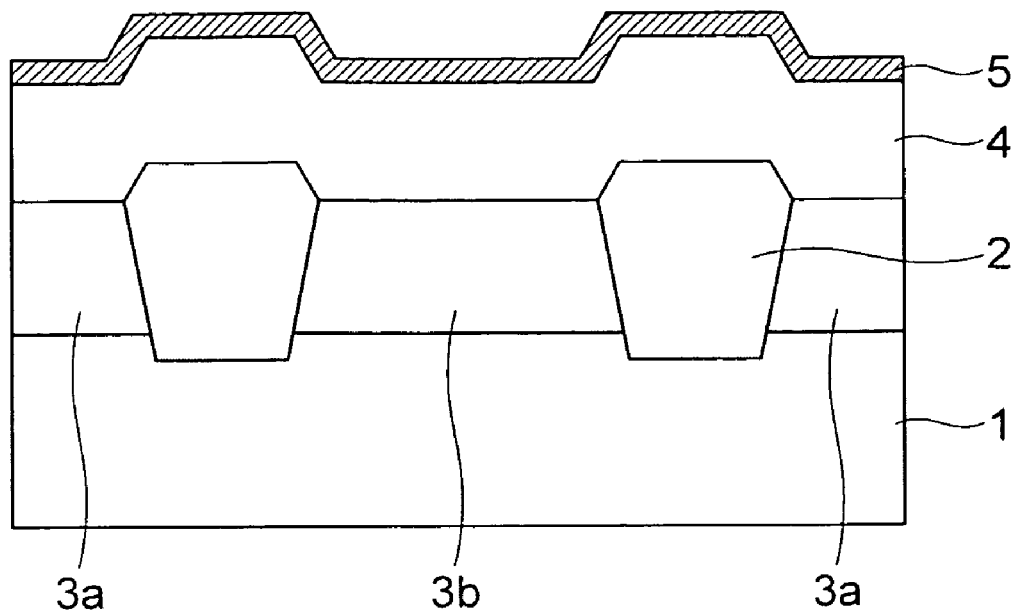
[Fig. 1d]
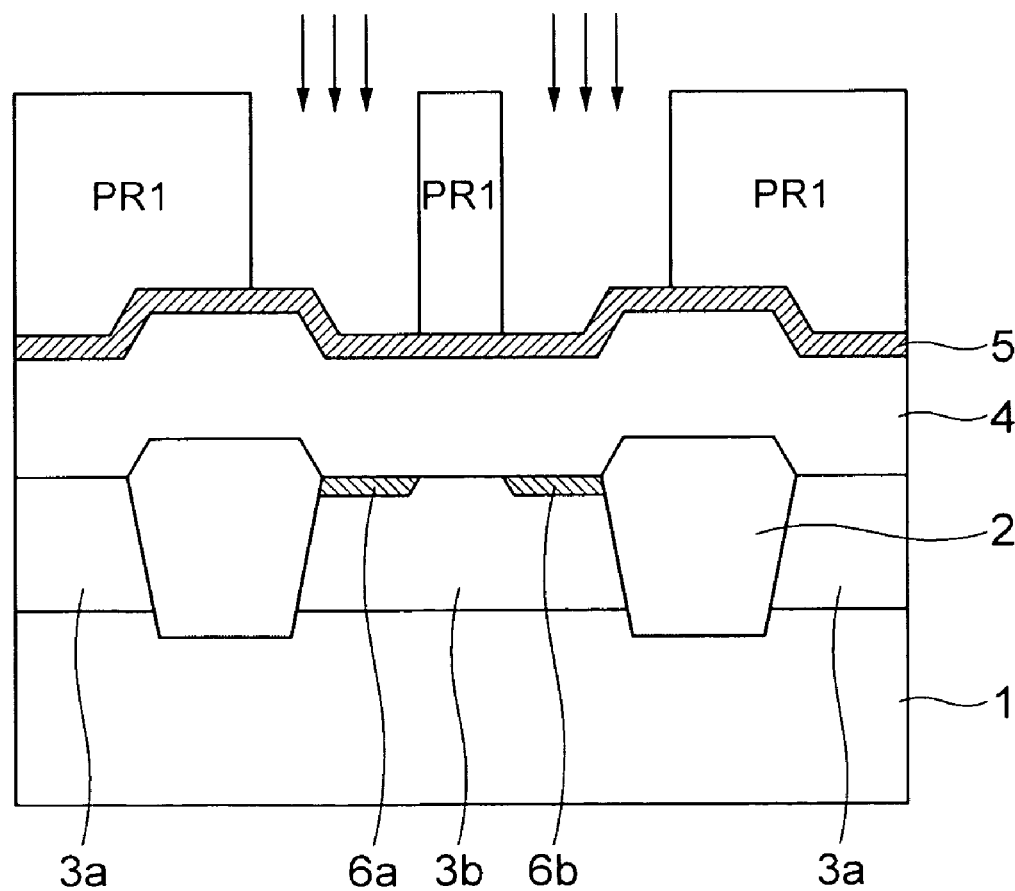

[Fig. 1e]
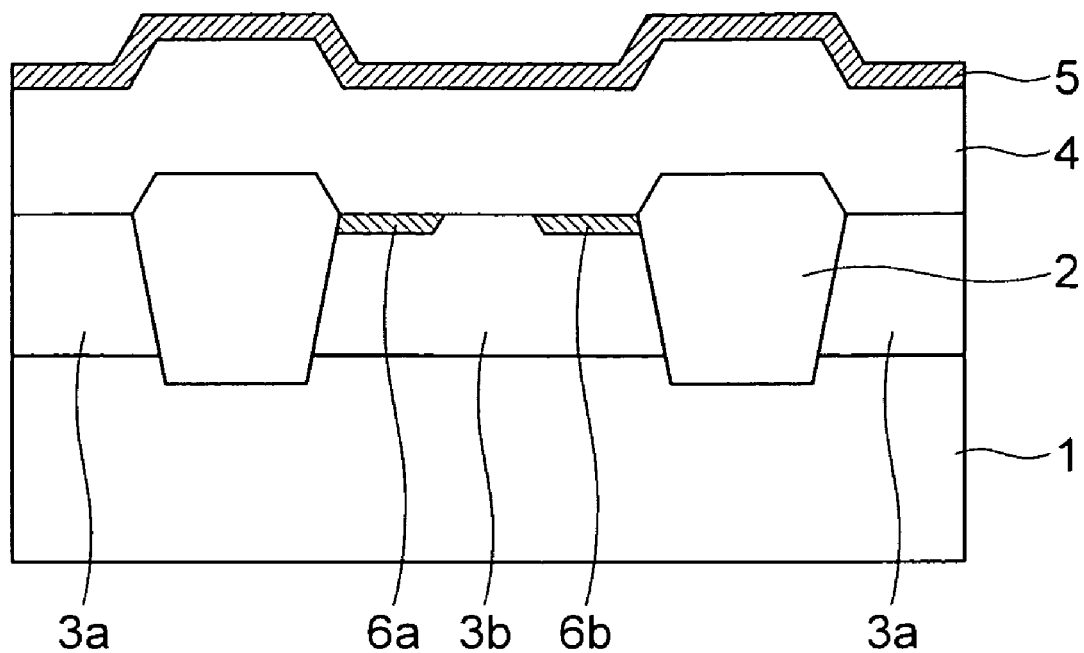
[Fig. 1f]
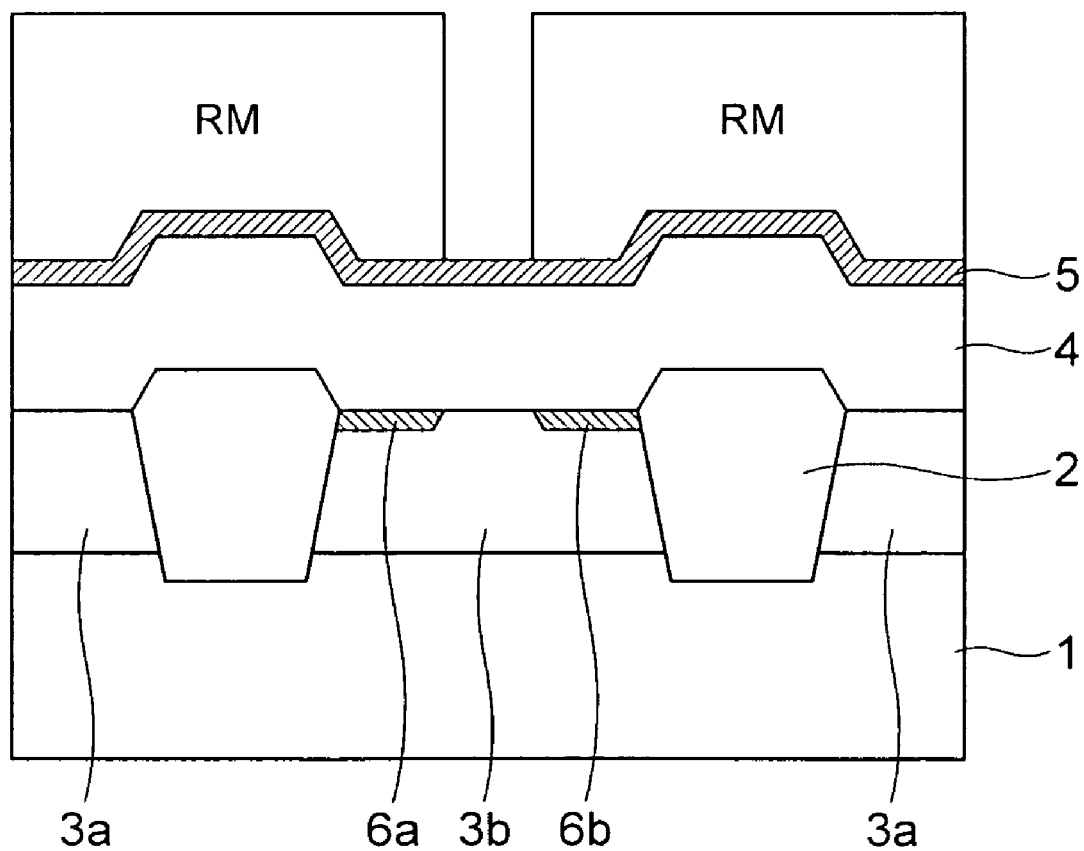

[Fig. 1g]
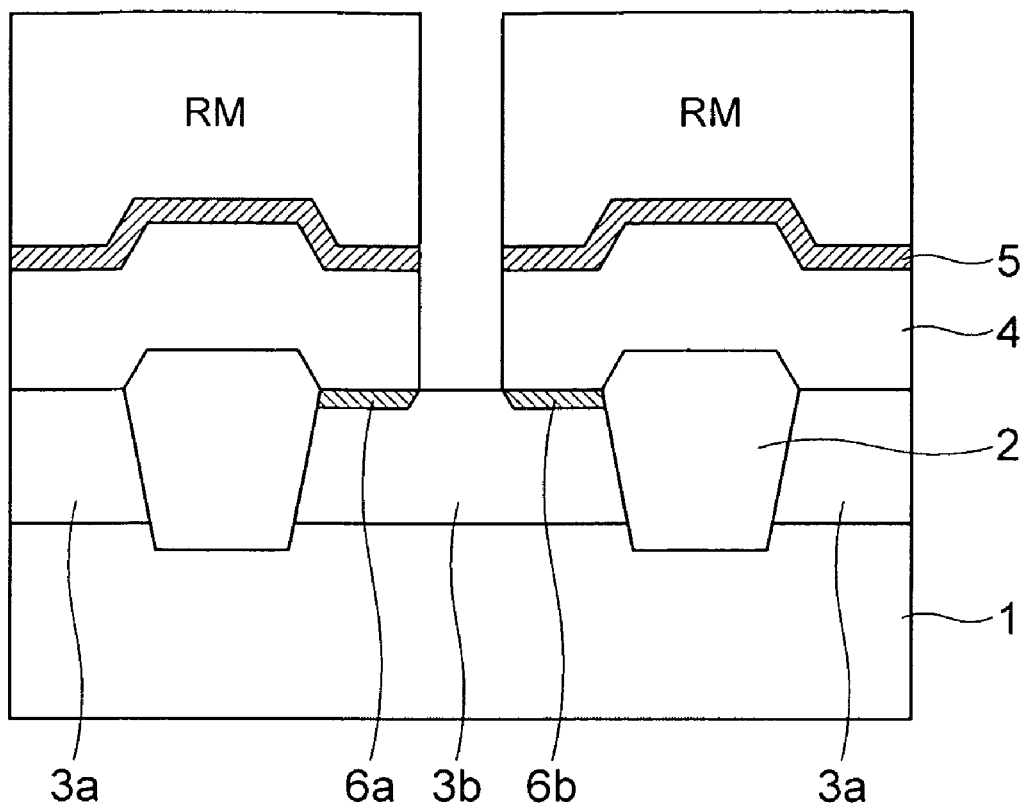
[Fig. 1h]
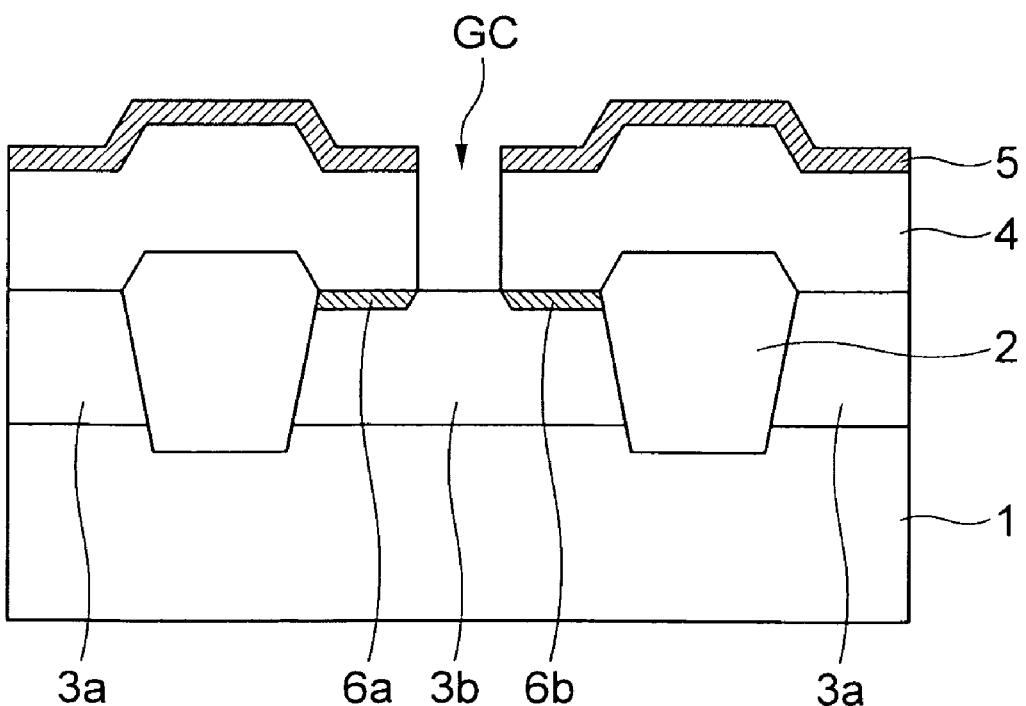

【Fig. 1i】
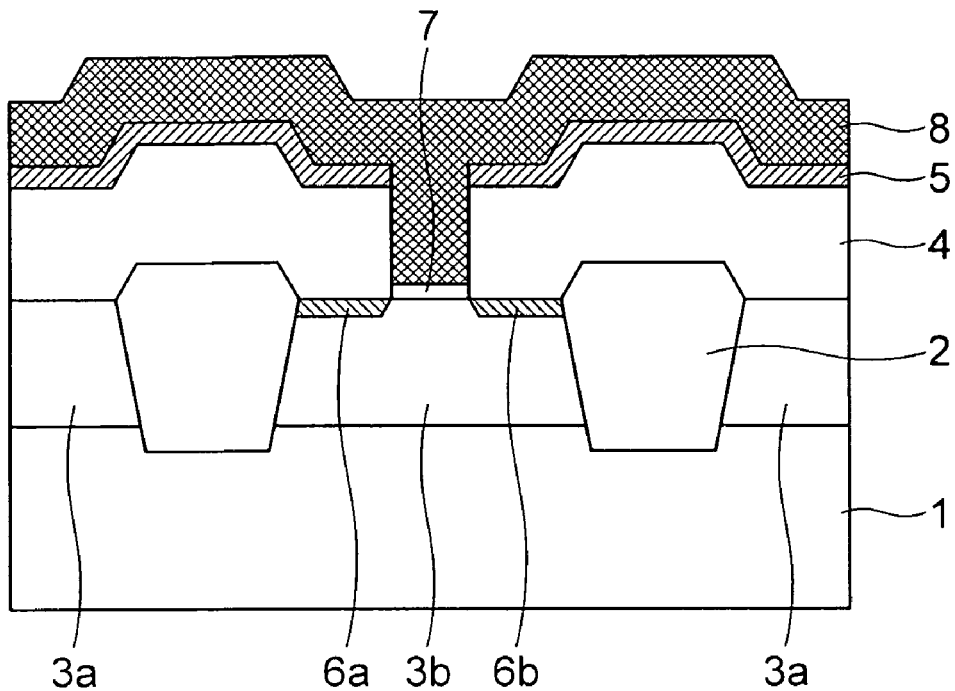
【Fig. 1j】
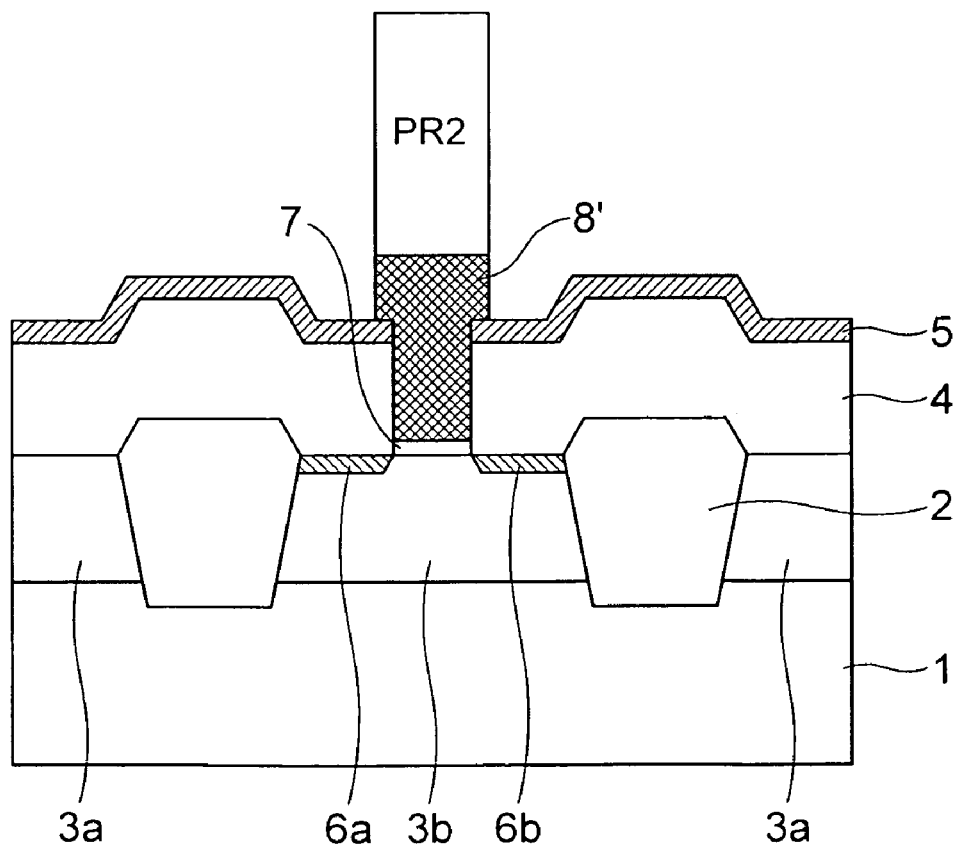

[Fig. 1k]
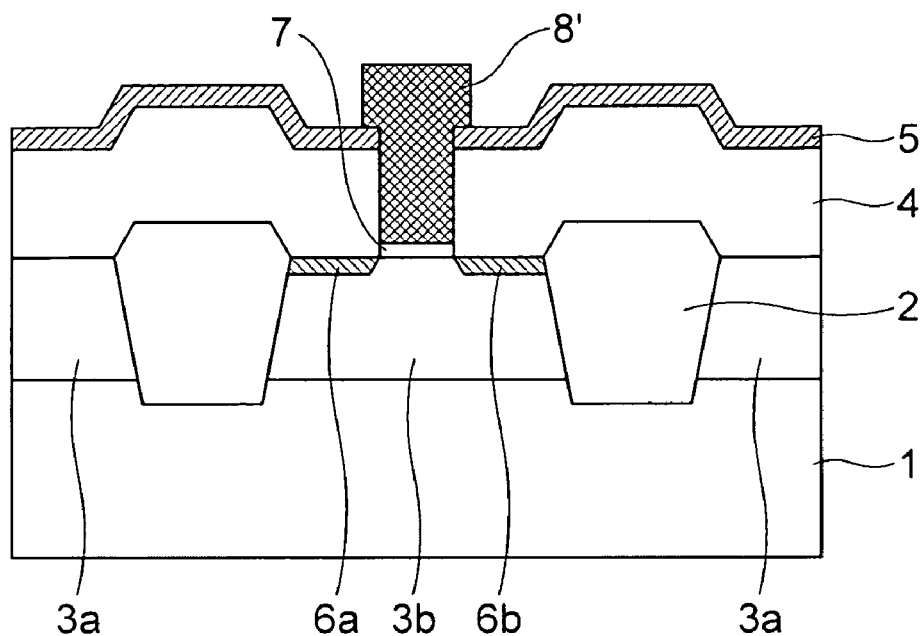
[Fig. 1l]
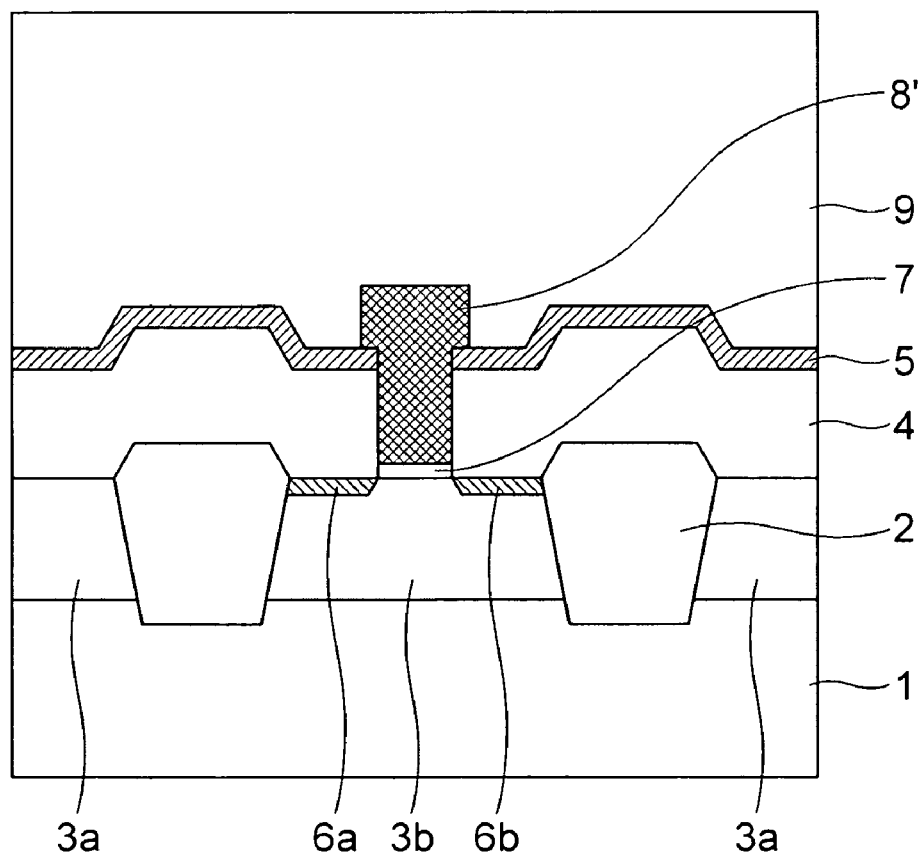

[Fig. 1m]
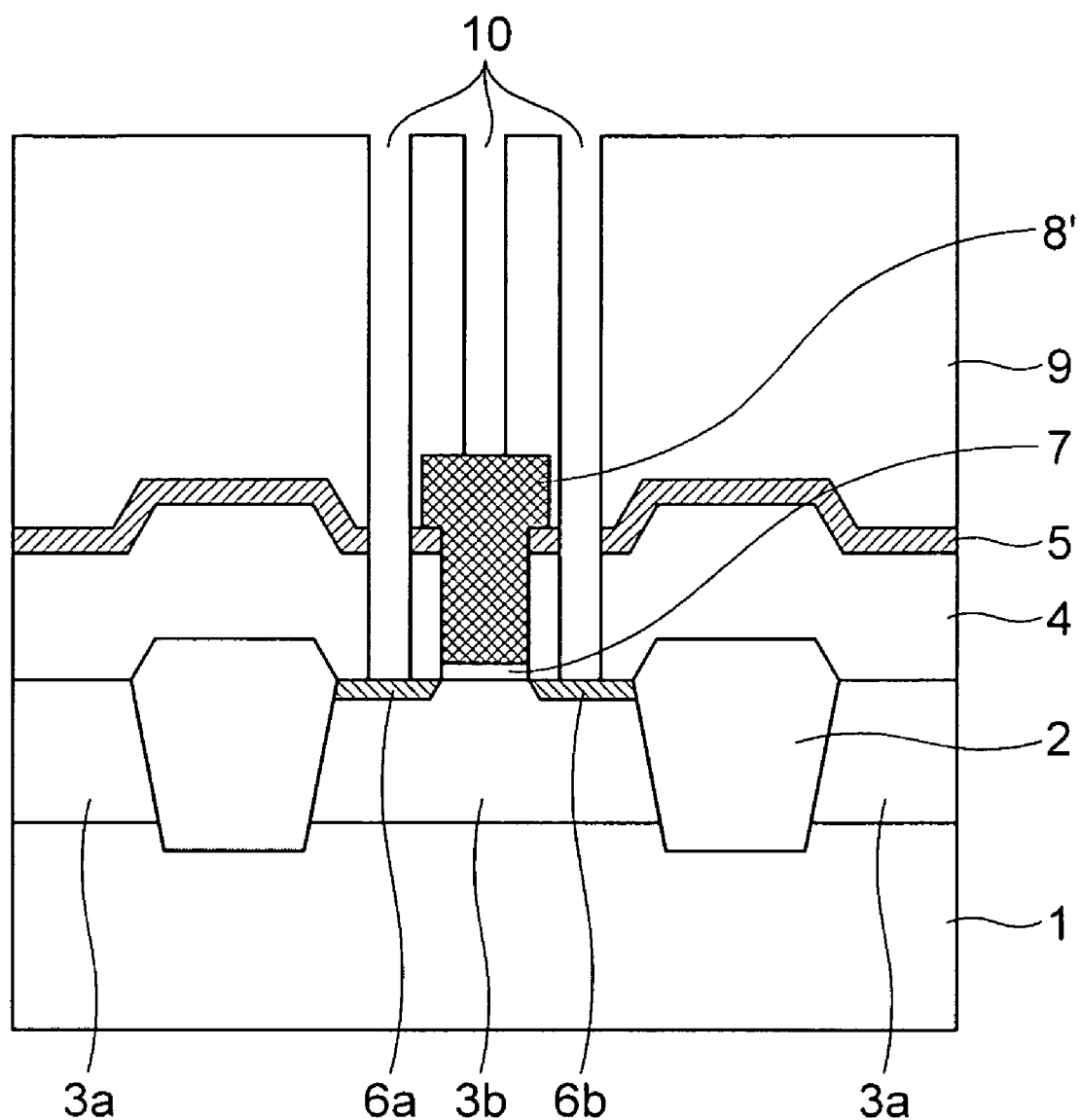

METHOD OF MANUFACTURING SEMICONDUCTOR DEVICE INCLUDING FORMING A T-SHAPE GATE ELECTRODE

BACKGROUND OF THE INVENTION

1. Field of the Invention

The present invention relates to a method of manufacturing a semiconductor device, and more specifically, to a method of manufacturing a semiconductor device, in which a gate electrode is formed in a T-shape in order to increase the size of a top surface of the gate electrode, thereby providing a stable silicide forming condition and preventing contact misalignment.

2. Background of the Related Art

With advancement in semiconductor techniques, high-speed and high-integration of semiconductor devices are rapidly progressed, and accordingly, requirements on scale down of patterns and high-precision of pattern sizes are gradually increased.

A large progress is accomplished in reduction of gate line width, copper wiring process, and the like in order to satisfy such conditions. In the case of gate/source/drain and a contact hole, high-integration and high-performance are accomplished using a technique of forming BorderlessContact.

Presently, the gate electrode of a semiconductor device is formed in a straight form where mainly gate oxide and polysilicon films are stacked, and a method of etching the polysilicon film using a mask pattern is used to form the gate electrode.

However, in such a method described above, it is difficult to form a metal silicide film on the top of the gate electrode since width of the gate electrode is decreased as the device is highly integrated more and more, and a resistance value of the metal silicide film is high and unstable.

In addition, generation of misalignment is gradually increased when a contact is formed, and it is difficult to for a gate electrode due to limit in a process.

Furthermore, since non-uniformity in thickness of inter-layer dielectric is increased, there is a problem of excessive over-etching when a contact is etched. Therefore, there is a problem in that the gate electrode is damaged, and silicon in the source/drain regions is etched, thereby deepening a junction region.

In order to improve such problems, a technique of forming a gate in a T-shape is disclosed in Korean Patent Application No. 2001-0037228.

However, in the technique, a T-shape gate electrode is formed by defining a gate region using photo-resist, depositing an insulation film on the other region, removing the photo-resist defining the gate region, depositing a gate material, and performing a post-process.

However, in this technique, a gate region is defined using photo-resist, and an insulation film is deposited thereon. At this point, there is a problem in that since the photo-resist cannot endure the insulation film deposition process of high temperature, a photo-resist pattern for defining the gate region is damaged.

SUMMARY OF THE INVENTION

Therefore, the present invention has been made in view of the above problems, and it is an object of the present invention to provide a method of manufacturing a semiconductor device, in which a gate electrode is formed in a T-shape in order to increase the size of a top surface of the gate electrode, thereby providing a stable silicide forming condition and preventing contact misalignment of the gate electrode.

To accomplish the above object, according to one aspect of the present invention, there is provided a method of manufacturing a semiconductor device, the method comprising the steps of: forming a buffer layer formed of a dual-layers structure of a buffer oxide film and a buffer nitride film on a semiconductor substrate formed with a certain lower structure; forming source/drain by performing an ion injection process after forming the buffer layer; defining a gate hole by etching the buffer layer after forming the source/drain; forming a gate oxide film on the defined gate hole; forming a gate material to bury the defined gate hole; forming a T-shape gate electrode through a process of etching the gate material using the buffer nitride film as an etching stop film; and forming a contact hole after forming an inter-layer dielectric on a resulting structure formed with the T-shape gate electrode.

A photo-resist pattern defining source/drain regions is formed on the buffer layer before the source/drain are formed.

In addition, in the step of defining a gate hole by etching the buffer layer, a reverse mask pattern is formed on a top of the gate material, and then the gate hole is defined through an etching processing using the reverse mask pattern as an etching mask.

In addition, the buffer nitride film can be used as an anti-reflection coating in an etching process for forming the contact hole. Or, the buffer nitride film can be removed before the gate electrode is formed in order to improve gate electrode profile.

In addition, the gate material can be formed of polysilicon or metal silicide.

In the present invention, in the etching process for forming the contact hole, a contact hole can be separately formed in each of the gate electrode and the source/drain to expose a corresponding region, and the contact holes can be buried with metal silicide or a metal material.

The present invention is advantageous in that increase of resistance of silicide can be prevented by providing a stable silicide forming condition that is accomplished by increasing the length of the top surface of the gate electrode, and increase of contact resistance can be prevented by preventing contact misalignment, thereby preventing degradation of electric characteristics of a device.

BRIEF DESCRIPTION OF THE DRAWINGS

FIGS. 1a to 1m are cross-sectional views illustrating a method of manufacturing semiconductor devices according to an embodiment of the present invention.

DETAILED DESCRIPTION OF THE PREFERRED EMBODIMENT

FIGS. 1a to 1m are cross-sectional views illustrating a method of manufacturing semiconductor devices according to an embodiment of the present invention.

First, as shown in FIG. 1a, a device isolation film 2 is formed within a silicon substrate 1 by performing a shallow trench isolation (STI) in order to isolate devices.

Then, a P-well 3a and an N-well 3b isolated by the device isolation film 2 is formed on the silicon substrate 1 to define an NMOS region and a PMOS region.

Next, as shown in FIG. 1b, a buffer oxide film 4 having a thickness of 500□ to 1,500□ is formed on the substrate including the device isolation film 2.

Subsequently, a buffer nitride film 5 of 50□ to 150□ is deposited on the top of the buffer oxide film 4 as shown in FIG. 1c.

At this point, the buffer nitride film 5 functions as an etching stop film in a subsequent process of etching gate poly, and the buffer oxide film 4 on the bottom of the buffer nitride film functions as an etching barrier film in a process such as a cleaning process. The buffer nitride film 5 functions as an etching stop film in a subsequent metal contact etching process to minimize variation of thickness of inter-layer dielectric, and thus a borderless contact can be formed.

In addition, although the buffer nitride film 5 is used as an etching stop film in the present invention, the buffer nitride film 5 can be removed through a wet etching process in order to improve profile of the gate electrode in another modified embodiment.

Although a dual-layers structure of the buffer oxide film 4 and the buffer nitride film 5 is formed in an embodiment of the present invention, a stacked structure of buffer oxide/buffer nitride/buffer oxide or a stacked structure of other insulation films can be used through another modified embodiment.

Subsequently, as shown in FIG. 1d, a photo-resist pattern PR1 defining source/drain regions is formed, and source/drain 6a and 6b are formed by performing an ion injection process. Thermal stability can be improved in a thermal process of diffusing ion by forming the source/drain regions first as described.

Although source/drain ion injection is performed before the gate is formed in the embodiment of the present invention, the source/drain ion injection can be performed after forming the gate electrode.

Subsequently, the photo-resist pattern PR1 is removed as shown in FIG. 1e, and a reverse mask RM for limiting a region where the gate is formed is formed on the buffer nitride film 5 as shown in FIG. 1f.

Next, as shown in FIG. 1g, the buffer nitride film 5 and the buffer oxide film 4 are etched using the reverse mask pattern RM as an etching mask so that the substrate is exposed.

Subsequently, a gate hole GC is formed as shown in FIG. 1h by removing the reverse mask pattern RM and performing a cleaning process for removing particles remaining on a resulting substrate.

Next, a gate oxide film 7 is formed on the top of the substrate 1 exposed by, the gate hole GC (refer to FIG. 1h) as shown in FIG. 1i, and a polysilicon film 8 is deposited on the whole surface of the substrate 1 using a gate electrode material. At this point, the polysilicon film 8 is deposited as thick as the gate hole GC (refer to FIG. 1h) is gap-filled without void.

Although the polysilicon film 8 is used as a gate electrode material in the embodiment of the present invention, metal silicide or other metal materials can be used in order to reduce resistance of the gate electrode through another modified embodiment.

Next, a photo-resist pattern PR2 for defining a gate region is formed on the top of the polysilicon film 8, and a T-shape gate electrode 8' is formed by etching the polysilicon film 8 using the photo-resist pattern PR2 as shown in FIG. 1j.

Here, the buffer nitride film 5 can be used as an etching stop film when the polysilicon film 8 is etched.

Then, the photo-resist pattern PR2 is removed as shown in FIG. 1k, and an inter-layer dielectric (ILD) 9 is deposited as shown in FIG. 1l.

Next, a contact hole is formed as shown in FIG. 1m by performing subsequent publicized process. Here, the contact hole can be formed such that the gate electrode and the source/drain 6a and 6b are separately exposed.

Then, the contact hole 10 can be buried with silicide or a metal material in order to reduce contact resistance.

In addition, the buffer nitride film 5 can be used as an anti-reflection coating when an etching process is performed to form the contact hole 10.

According to the present invention described above, unlike a conventional process of forming a gate electrode of a straight form, a T-shape gate electrode is formed, and thus the width of the top surface of the gate electrode is broadened. Therefore, a subsequent silicide process can be stably performed. Accordingly, occurrence of misalignment is reduced when a contact is performed, and thus a resistance value of a contact hole can be reduced.

In addition, in the present invention, the buffer nitride film functions as an etching stop film when the polysilicon film, which is a gate electrode material, is etched and prevents etching the buffer oxide film on the bottom surface, which occurs in a cleaning process.

As described above, since a dual-layers structure of the buffer oxide film and buffer nitride film is applied, stress generated by a thermal expansion coefficient of the polysilicon film of the gate electrode is effectively reduced, and a borderless contact can be formed by minimizing variation of thickness of the inter-layer dielectric owing to the buffer nitride film.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A method of manufacturing a semiconductor device, the method comprising the steps of:
   forming a buffer layer formed of a dual-layers structure of a buffer oxide film and a buffer nitride film on a semiconductor substrate formed with a certain lower structure;
   forming source/drain by performing an ion injection process through the buffer layer after forming the buffer layer, the buffer layer not being etched before forming the source/drain;
   defining a gate hole by etching the buffer layer after forming the source/drain;
   forming a gate oxide film on the defined gate hole;
   forming a gate material to bury the defined gate hole;
   forming a T-shape gate electrode through a process of etching the gate material using the buffer nitride film as an etching stop film; and
   forming a contact hole after forming an inter-layer dielectric on a resulting structure formed with the T-shape gate electrode.

2. The method according to claim 1, wherein a photo-resist pattern defining source/drain regions is formed on the buffer layer before the source/drain are formed.

3. The method according to claim 1, wherein in the step of defining a gate hole by etching the buffer layer, a reverse mask pattern is formed on a top of the buffer layer, and then the gate hole is defined through an etching process using the reverse mask pattern as an etching mask.

4. The method according to claim 1, wherein the buffer nitride film is used as an anti-reflection coating in an etching process for forming the contact hole.

5. The method according to claim 1, wherein in the etching process for forming the contact hole, a contact hole can be separately formed in each of the gate electrode and the source/drain to expose a corresponding region.

* * * * *